(12) United States Patent
Iwasaki et al.

(10) Patent No.: US 10,704,162 B2
(45) Date of Patent: Jul. 7, 2020

(54) ALUMINUM NITRIDE SINGLE CRYSTAL

(71) Applicant: JFE MINERAL COMPANY, LTD, Minato-ku, Tokyo (JP)

(72) Inventors: Yosuke Iwasaki, Tokyo (JP); Keiichiro Nakamura, Tokyo (JP)

(73) Assignee: JFE MINERAL COMPANY, LTD, Minato-ku, Tokyo (JP)

( * ) Notice: Subject to any disclaimer, the term of this patent is extended or adjusted under 35 U.S.C. 154(b) by 0 days.

(21) Appl. No.: 16/067,923

(22) PCT Filed: Dec. 21, 2016

(86) PCT No.: PCT/JP2016/088193
§ 371 (c)(1),
(2) Date: Jul. 3, 2018

(87) PCT Pub. No.: WO2017/119305
PCT Pub. Date: Jul. 13, 2017

(65) Prior Publication Data
US 2019/0186044 A1  Jun. 20, 2019

(30) Foreign Application Priority Data
Jan. 7, 2016  (JP) .................. 2016-001732

(51) Int. Cl.
*C30B 29/40* (2006.01)
*H01L 21/02* (2006.01)
*H01L 29/20* (2006.01)

(52) U.S. Cl.
CPC ...... *C30B 29/403* (2013.01); *H01L 21/02389* (2013.01); *H01L 29/2003* (2013.01)

(58) Field of Classification Search
None
See application file for complete search history.

(56) References Cited

U.S. PATENT DOCUMENTS

| 6,001,748 A | 12/1999 | Tanaka et al. |
| 6,501,154 B2 * | 12/2002 | Morita ............ H01S 5/3202 257/628 |
| 8,148,712 B2 | 4/2012 | Miki et al. |
| 2009/0146161 A1 * | 6/2009 | Miki ............ C23C 16/0272 257/94 |

(Continued)

FOREIGN PATENT DOCUMENTS

| JP | H02311399 A | 12/1990 |
| JP | H1053495 A | 2/1998 |
| JP | 2002060297 A | 2/2002 |

(Continued)

OTHER PUBLICATIONS

Definition periphery; https://www.merriam-webster.com/dictionary/periphery; Dec. 7, 2019.*

(Continued)

*Primary Examiner* — Guinever S Gregorio
(74) *Attorney, Agent, or Firm* — Kenja IP Law PC

(57) ABSTRACT

Provided is an aluminum nitride single crystal which is easier to cut than conventional ones. The presently disclosed aluminum nitride single crystal 1 has a matrix region M constituting a matrix of the aluminum nitride single crystal, and at least one domain region D included in the matrix region M.

4 Claims, 1 Drawing Sheet

(56) References Cited

U.S. PATENT DOCUMENTS

2013/0062660 A1* 3/2013 Hayashi .............. H01L 33/32
257/103

FOREIGN PATENT DOCUMENTS

| JP | 2006069814 A | 3/2006 |
|---|---|---|
| JP | 2012188294 A | 10/2012 |
| JP | 2013060343 A | 4/2013 |
| JP | 2013159511 A | 8/2013 |
| KR | 1020080098550 A | 11/2008 |
| WO | 2007129773 A1 | 11/2007 |

OTHER PUBLICATIONS

Mar. 21, 2017, International Search Report issued in the International Patent Application No. PCT/JP2016/088193.

Michimasa Miyanaga et al., Single Crystal Growth of AlN by Sublimation Method, SEI Technical Review, Mar. 2006, pp. 103-106, vol. 168.

Feb. 12, 2019, Notification of Reasons for Refusal issued by the Japan Patent Office in the corresponding Japanese Patent Application No. 2016-001732 with English language concise statement of relevance.

Akito Kuramata et al., Substrates for III-V nitride semiconductors, Oyo Buturi, 1996, pp. 936-940, vol. 65, No. 9 with a partial English translation.

Jul. 3, 2019, The Extended European Search Report issued by the European Patent Office in the corresponding European Patent Application No. 16883804.3.

Sep. 24, 2019, Notification of Reasons for Refusal issued by the Japan Patent Office in the corresponding Japanese Patent Application No. 2016-001732 with English language Concise Statement of Relevance.

Feb. 27, 2020, Office Action issued by the Korean Intellectual Property Office in the corresponding Korean Patent Application No. 10-2018-7019926 with English language concise statement of relevance.

Robert T. Bondokov et al., Large-area AlN substrates for electronic applications: An industrial perspective, Journal of Crystal Growth, 2008, pp. 4020-4026, 310.

Apr. 14, 2020, Official Decision of Refusal issued by the Japan Patent Office in the corresponding Japanese Patent Application No. 2016-001732 with English language concise statement of relevance.

\* cited by examiner

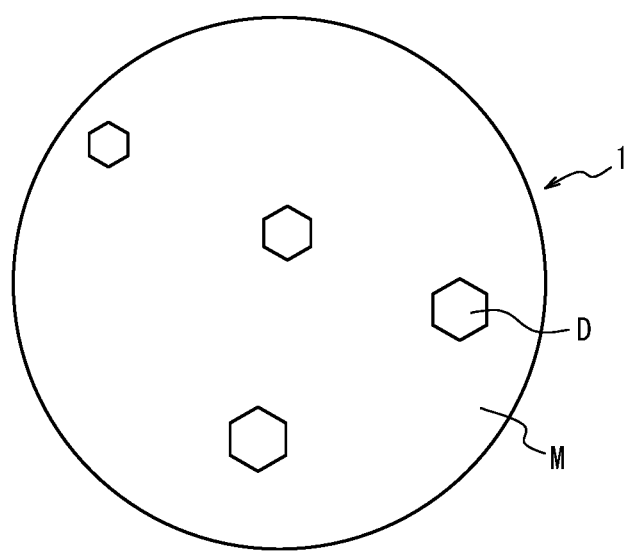

ALUMINUM NITRIDE SINGLE CRYSTAL

TECHNICAL FIELD

This disclosure relates to an aluminum nitride single crystal, particularly to an aluminum nitride single crystal which is easier to cut than conventional ones.

BACKGROUND

In recent years, aluminum nitride (hereinafter also referred to as "AlN") single crystal is gaining attention as a substrate material for semiconductor devices such as various optical devices and electronic devices, because aluminum nitride single crystal has wide energy band gap, high thermal conductivity and high electrical resistance.

Examples of conventional method of producing an AlN single crystal includes a sublimation method in which an AlN crystal material is placed in a crucible and then the sublimated AlN is grown as single crystal (e.g. see JP H10-53495 A (PTL 1)). In the sublimation method, a powder of a single crystal material, and a powder of an oxide which reacts with the material to decompose and vaporize AlN when heated, are mixed to obtain a mixed powder, and the mixed powder is heated in a nitrogen atmosphere, or in a nitrogen atmosphere containing hydrogen or carbon, at a temperature lower than the sublimation temperature or the melting temperature of the material, to decompose and vaporize the mixed powder into AlN, so that the decomposed and vaporized component grows as crystal on a substrate.

However, the conventional method of producing an AlN single crystal by sublimation is likely to cause cracks in crystal during the growing process of the desired single crystal. When cracks occur in a crystal, it is extremely difficult, or may be impossible in some cases, to use a wafer made of such a crystal as a reliable substrate for device production. That is to say, commercial devices used for epitaxial growth, photo lithography and other device processes require a circular wafer of uniform thickness and perfect shape. Cracks impair the utility of the wafer even when they are too small to cause separation of the wafer. Therefore, solution to the problem of cracks during the AlN crystal growth is extremely important for further development of nitride-based electronic equipment.

The sublimation method includes, for example, heteroepitaxial growth using a heterogeneous single crystal as the substrate, and homoepitaxial growth using a homogeneous single crystal as the substrate. The substrate can be fixed to a pedestal (the upper part of the crucible) using an adhesive, which is a known method of fixing the substrate (see JP 2002-60297 A (PTL 2)). In this case, a difference in coefficient of thermal expansion between the substrate and the pedestal may cause thermal stress. The homoepitaxial growth using a homogeneous substrate as the substrate can reduce the thermal stress, yet cannot solve the problem of high possibility of crack occurrence in the produced single crystal.

A known means to prevent the cracks caused by a difference in coefficient of thermal expansion is to, as described in SEI Technical Review, No. 168-(103), published in March, 2006 (NPL 1), increase the thickness of the crystal to reduce the curvature radius caused by thermal stress.

However, the technique of thickening the crystal to reduce the curvature radius is based on the assumption that there is a difference in coefficient of thermal expansion only between the crystal and the substrate, with no reference to the difference in coefficient of thermal expansion between the substrate and the pedestal. Taking the difference in coefficient of thermal expansion between the substrate and the pedestal into consideration, it is insufficient to merely thicken the single crystal when using the sublimation method to produce a single crystal.

Therefore, JP 2013-159511 A (PTL 3) proposes a single crystal production apparatus with which a grown single crystal such as a grown MN single crystal can be taken out, for example, with no cracks or breaks.

CITATION LIST

Patent Literature

PTL 1: JP H10-53495 A
PTL 2: JP 2002-60297 A
PTL 3: JP 2013-159511 A

Non-Patent Literature

NPL 1: SEI Technical Review, No. 168-(103), published in March, 2006

SUMMARY

Technical Problem

With the techniques described in the above patent and non-patent literatures, it is possible to obtain an AlN single crystal with high quality and few cracks. The resulting AlN single crystal of these techniques is then subjected to a wafer-forming process to produce a large number of AlN single crystal wafers. However, since the AlN single crystal is harder than other substrate materials such as silicon, there has been a problem that the wafer-forming process takes too much time. It could thus be helpful to provide an aluminum nitride single crystal which is easier to cut than conventional ones.

Solution to Problem

As a result of keen examination, we discovered that it is extremely effective to constitute an aluminum nitride single crystal having a matrix region that constitutes a matrix of the crystal, and at least one domain region included in the matrix region, and completed the present disclosure.

We thus provide the following.

(1) An aluminum nitride single crystal comprising a matrix region that constitutes a matrix of the aluminum nitride single crystal, and at least one domain region included in the matrix region.

(2) The aluminum nitride single crystal according to (1), wherein at least one of the at least one domain region is in an outer peripheral portion.

(3) The aluminum nitride single crystal according to (2), wherein the at least one domain region is only in the outer peripheral portion.

(4) The aluminum nitride single crystal according to (2), wherein the at least one domain region is in the outer peripheral portion and in a portion more inside than the outer peripheral portion.

(5) The aluminum nitride single crystal according to any one of (1) to (4), wherein at least one of the at least one domain region extends over the entire aluminum nitride single crystal in crystal growth direction.

(6) The aluminum nitride single crystal according to any one of (1) to (5) having a crystal structure of a wurtzite structure.

Advantageous Effect

According to the present disclosure, the aluminum nitride single crystal is constituted to have at least one domain region in a matrix region which is the matrix of the crystal, and therefore the aluminum nitride single crystal is easier to cut than conventional ones.

BRIEF DESCRIPTION OF THE DRAWING

In the accompanying drawing:
FIG. 1 is a schematic view of an example of the presently disclosed aluminum nitride single crystal.

DETAILED DESCRIPTION

The following describes an embodiment of the present disclosure with reference to the drawing. FIG. 1 illustrates an example of the present disclosed aluminum nitride single crystal. The aluminum nitride single crystal 1 illustrated in this FIGURE has a matrix region M constituting the matrix of the aluminum nitride single crystal 1, and at least one domain region D included in the matrix region M.

As stated above, the techniques described in the patent and non-patent literatures can provide an AlN single crystal with high crystallinity and few cracks. However, since the AlN single crystal is harder than other substrate materials such as silicon, there has been a problem that the wafer-forming process takes too much time.

We found that, when subjecting AlN single crystals obtained under various growth conditions to the wafer-forming process to produce a large number of AlN wafers, there was an AlN single crystal which is easier to cut and has a shorter cutting time than those obtained under different conditions. Therefore, we investigated the AlN single crystal in detail to specify the reason why the AlN single crystal could be easily cut.

Specifically, first, the AlN single crystal that could be easily cut was subjected to the wafer-forming process to produce an AlN single crystal wafer. Next, the produced AlN single crystal wafer was subjected to focused ion beam (FIB) to collect a piece of sample. Subsequently, the sample was observed in detail with a transmission electron microscope (TEM). The transmission electron microscope was the H-9000NAR manufactured by Hitachi High-Technologies Corporation, the accelerating voltage was 300 kV, the total magnification was 15000 times, and the measurement conditions of weak-beam method were g/3 g and g=1-100. As a result, it was found that there were "domain regions" D in a matrix region M, where the matrix region M was the matrix of the crystal and the domain region D is a different region that can be clearly distinguished from the matrix region M.

We initially considered that the crystal was polycrystallized during the production, so that the resulting crystal was not an intended single crystal and polycrystalline regions in single crystal, in other words, domains were observed, where the domains were the "domain regions" D. However, as a result of investigating an AlN wafer made of the same crystal as the wafer where the sample was collected by X-ray diffraction, we found that the AlN wafer had a specific sharp peak, which indicated it was a single crystal, and a spectrum similar to that of an AlN single crystal free from the domain region D.

That is to say, when performing rocking curve measurement with an X-ray diffractometer, which was the D8 DISCOVER manufactured by Bruker, to determine the full width at half maximum (FWHM), the result value was similar to that of an AlN single crystal free from the domain region D. Note that the diffracting surface measured in this case was the (0001) plane.

We further evaluated the thermal characteristics and electrical characteristics of the AlN wafer, and found that both characteristics were similar to that of an AlN single crystal only consisting of a matrix region M and free from the domain region D.

Although the reason why the presence of the domain region D renders the crystal cutting easy is not necessarily clear, it is considered that the bond of atoms between the domain region D and the matrix region M is weaker than the bond of atoms of single crystal inside the matrix region M or the domain region D, and therefore exfoliation or the like occurs at the boundary between the matrix region M and the domain region D when applying stress to the crystal during the cutting, rendering the cutting easy.

In this way, we found that when an AlN single crystal 1 has a matrix region M constituting the matrix of the crystal and at least one domain region D included in the matrix region M, the AlN single crystal 1 can be easily cut as compared with an AlN single crystal free from the domain region D while possessing characteristics similar to that of an AlN single crystal free from the domain region D. We thereby completed the disclosure. The following describes each constituent part in more detail.

The matrix region M, which consists of one crystal, is a single crystal region constituting the matrix of the AlN single crystal 1. In the present disclosure, at least 50% of the entire crystal is the matrix region M.

The domain region D is a single crystal region included in the matrix region M. In the present disclosure, the domain region D is defined as a region satisfying the following requirement. First, the AlN single crystal 1 is subjected to a wafer-forming process to produce an AlN single crystal wafer. Next, focused ion beam (FIB) is used to prepare a piece of sample having a thickness of 0.1 μm to 0.5 μm. Subsequently, the sample is subjected to TEM observation under conditions of an accelerating voltage of 300 kV and a total magnification of 15000 times. In a case where a matrix region M constituting the matrix of the AlN single crystal 1 includes a region that can be clearly distinguished from the matrix region M, the region is defined as the "domain region" D in the present disclosure.

The presently disclosed AlN single crystal 1, which is specified by the matrix region M and the domain region D, has an X-ray diffraction pattern satisfying the following requirement. When using an X-ray diffractometer to determine the X-ray diffraction pattern of an AlN single crystal wafer obtained by subjecting the AlN single crystal 1 to a wafer-forming process, the full width at half maximum relative to the peak of the (0001) plane is 100 arcsec or less. In this way, the presently disclosed AlN single crystal 1 can be clearly distinguished from an AlN polycrystal. That is to say, no peak is observed in a specific direction in the X-ray diffraction pattern of an AlN polycrystal.

The shape of the domain region D in a cross section perpendicular to the crystal growth direction is not particularly limited. The shape depends on the crystal structure. When the crystal structure is a wurtzite structure, a hexagon as illustrated in FIG. 1 can be obtained in a cross section perpendicular to the crystal growth direction. Note that the hexagon is merely an example, and the shape is not limited and may be any indefinite shape such as an irregular shape. The crystal axis direction is substantially the same as the crystal axis direction of the matrix region M.

In the present disclosure, it is preferable that at least one of the domain regions D is in the outer peripheral portion of the AlN single crystal 1. The presence of the domain region D in the outer peripheral portion of the crystal reduces the load at the start of the cutting and facilitates the cutting. The "outer peripheral portion of the AlN single crystal 1" means a region within 3 mm of the diameter from the outer periphery in a cross section perpendicular to the crystal growth direction of the AlN single crystal 1.

From the perspective of, for example, the uniformity of the semiconductor chip to be fabricated on the wafer, the domain regions D are preferably only in the outer peripheral portion of the crystal 1. When fabricating a rectangular chip on a circular wafer, it is possible to leave the outer peripheral portion and simply use a portion free from the domain region D.

On the other hand, from the perspective of shortening the time of the wafer-forming process, the domain regions D are preferably not only in the outer peripheral portion of the AlN single crystal 1 but also in a portion radially more inside than the outer peripheral portion relative to the direction perpendicular to the growth axis direction of the AlN single crystal 1. In this way, it is possible to shorten the cutting time not only at the start of the cutting but also in the middle of the cutting, so that the productivity of the wafer-forming process can be further improved.

Furthermore, it is preferable that at least one of the domain regions D extends over the entire crystal in the crystal growth direction. This makes it easy to cut the AlN single crystal 1 at an arbitrary position when performing a wafer-forming process to the AlN single crystal 1. In this way, the cutting time can be further shortened and the productivity of the wafer-forming process can be further improved.

With respect to the size of each domain region D, it is preferably, for example, 1 µm or more and 1000 µm or less for a domain in a regular shape such as a hexagon. A size of 1 µm or more can sufficiently exhibit the effect of shortening the cutting time of the AlN single crystal 1. On the other hand, a size exceeding 1000 µm saturates the effect of shortening the cutting time of the AlN single crystal 1. Therefore, the size of the domain region D is preferably 1 µm or more and 1000 µm or less. The size of the domain region D is more preferably 100 µm or more and 500 µm or less.

Moreover, the ratio of the domain region D in an arbitrary cross section with respect to the growth direction is preferably 0.01% or more and 1% or less. A ratio of 0.01% or more can sufficiently exhibit the effect of shortening the cutting time of the AlN single crystal 1. On the other hand, a ratio exceeding 1% saturates the effect of shortening the cutting time of the AlN single crystal 1. Therefore, the ratio of the domain region D is preferably 0.01% or more and 1% or less. The ratio of the domain region D is more preferably 0.1% or more and 1% or less.

In this way, the presently disclosed AlN single crystal 1 has characteristics similar to that of an AlN single crystal only consisting of a matrix region M, and can be easily cut.

EXAMPLES

The following further describes the present disclosure with reference to examples. However, the present disclosure is not limited to the following examples in any way.

Example 1

An AlN single crystal of the example (Example 1) of the present disclosure was prepared. Specifically, an AlN single crystal having a diameter of 1 inch and a length of 10 mm was prepared. An AlN single crystal produced under the same conditions as the AlN single crystal was subjected to a wafer-forming process to obtain three AlN wafers, and the three AlN wafers were subjected to TEM observation. As a result, no domain region was found in the outer peripheral portion of the wafer, yet the domain regions were found in a region more inside than the outer peripheral portion in the radial direction of the wafer. Accordingly, there is a high possibility that the AlN single crystal of Example 1 of the present disclosure only has the domain regions in a portion more inside than the outer peripheral portion of the crystal as well.

Comparative Example

As in Example 1, an AlN single crystal of Comparative Example of the present disclosure was prepared. An AlN single crystal produced under the same conditions as the AlN single crystal of Comparative Example was subjected to a wafer-forming process to obtain three AlN wafers, and the three AlN wafers were subjected to TEM observation. However, none of the three AlN wafers was observed to have any domain region in the matrix region. Accordingly, there is a high possibility that the AlN single crystal of Comparative Example of the present disclosure has no domain region in the matrix region, either.

Example 2

As in Example 1, an AlN single crystal of Example 2 was prepared. However, in this case, the domain regions were only found in the outer peripheral portion of an AlN single crystal produced under the same conditions as the AlN single crystal of Example 2. Accordingly, there is a high possibility that the AlN single crystal of Example 2 of the present disclosure only has the domain regions in the outer peripheral portion of the crystal as well. The others are the same as in Example 1.

Example 3

As in Example 1, an AlN single crystal of Example 3 was prepared. However, in this case, the domain regions were found in both of the outer peripheral portion and a region radially more inside than the outer peripheral portion of an AlN single crystal produced under the same conditions as the AlN single crystal of Example 3. Accordingly, there is a high possibility that the AlN single crystal of Example 3 of the present disclosure also has the domain regions in both of the outer peripheral portion and a region more inside than the outer peripheral portion of the crystal. The others are the same as in Example 1.

<Evaluation of Crystallinity>

The crystallinity of the AlN single crystals of Examples 1 to 3 and Comparative Example was evaluated. Specifically, rocking curve measurement was performed to determine the full width at half maximum (FWHM). The results were 87 arcsec for Example 1, 76 arcsec for Example 2, and 82 arcsec for Example 3. On the other hand, it was 85 arcsec for Comparative Example. No great difference was found in crystallinity between Examples 1 to 3 and Comparative Example, and therefore Examples 1 to 3 and Comparative Example were considered to have comparable crystal quality.

<Evaluation of Time for Wafer-Forming Process>

The AlN single crystals of Examples and Comparative Examples prepared as described above were subjected to a wafer-forming process, and the time taken by the process was measured. Specifically, the AlN single crystals of Examples and Comparative Example were subjected to a wafer-forming process using a multi-wire saw (the MWS-34S of Takatori) to produce ten AlN wafers with a thickness of 600 μm, and the time taken to cut the ten wafers was measured.

As a result, the cutting time was 480 minutes in Example 1, 450 minutes in Example 2, and 420 minutes in Example 3. On the other hand, the cutting time in Comparative Example was 540 minutes. Thus, it is understood that the presently disclosed AlN single crystal is easier to cut and has a shorter cutting time than the AlN single crystal of Comparative Example free from the domain region.

Additionally, when comparing Examples 1 to 3, it is understood that the cutting time in Example 2 is shorter than in Example 1, where the domain regions are in the outer periphery portion in Example 2, and the domain regions are in a portion radially more inside than the outer periphery portion in Example 1. Furthermore, it is understood that the cutting time in Example 3 is shorter than in Example 2, where the domain regions are in both of the outer periphery portion and a region radially more inside than the outer periphery portion in Example 3, and the domain regions are only in the outer periphery portion of the crystal in Example 2.

INDUSTRIAL APPLICABILITY

The present disclosure can shorten the time of the wafer-forming process, and is useful to the semiconductor industry.

REFERENCE SIGNS LIST 1 aluminum nitride single crystal
M matrix region
D domain region

The invention claimed is:

1. An aluminum nitride single crystal manufactured by a sublimation method, comprising
    a matrix region that constitutes a matrix of the aluminum nitride single crystal, and
    at least one domain region included in the matrix region,
    wherein, in a cross section perpendicular to a crystal growth direction of the aluminum nitride single crystal, the aluminum nitride single crystal has an outer peripheral portion within 3 mm inside an outer peripheral of the aluminum nitride single crystal and an inside portion more inside than the outer peripheral portion in a radial direction of the aluminum nitride single crystal, and
    the at least one domain region is only in the outer peripheral portion.

2. The aluminum nitride single crystal according to claim 1, wherein at least one of the at least one domain region extends over the entire aluminum nitride single crystal in the crystal growth direction.

3. The aluminum nitride single crystal according to claim 2 having a crystal structure of a wurtzite structure.

4. The aluminum nitride single crystal according to claim 1 having a crystal structure of a wurtzite structure.

* * * * *